United States Patent [19]

Kohda et al.

[11] Patent Number: 5,097,152
[45] Date of Patent: Mar. 17, 1992

[54] BUFFER CIRCUIT USED IN A SEMICONDUCTOR DEVICE OPERATING BY DIFFERENT SUPPLY POTENTIALS AND METHOD OF OPERATING THE SAME

[75] Inventors: Kenji Kohda; Tsuyoshi Toyama; Yasuhiro Kouro; Hiroyasu Makihara, all of Hyogo, Japan

[73] Assignee: Mitsubishi Denki Kabushiki Kaisha, Tokyo, Japan

[21] Appl. No.: 639,474

[22] Filed: Jan. 10, 1991

Related U.S. Application Data

[63] Continuation of Ser. No. 405,997, Sep. 12, 1989, Pat. No. 5,003,205.

[30] Foreign Application Priority Data

Nov. 4, 1988 [JP] Japan .................. 63-279572

[51] Int. Cl.⁵ ............... H03K 19/003; H03K 19/094; H03K 19/20
[52] U.S. Cl. .................. 307/475; 307/452; 307/469
[58] Field of Search ............ 307/443, 451, 452, 469, 307/571, 572, 579, 585, 475

[56] References Cited

U.S. PATENT DOCUMENTS

| | | |
|---|---|---|
| 4,571,509 | 2/1986 | Tobita . |
| 4,638,187 | 1/1987 | Boler et al. . |
| 4,680,487 | 7/1987 | Kobayashi . |
| 4,779,013 | 10/1988 | Tanaka . |
| 4,785,201 | 11/1988 | Martinez ............. 307/443 |
| 4,785,203 | 11/1988 | Nakamura . |
| 4,789,796 | 12/1988 | Foss ..................... 307/443 |
| 4,806,794 | 2/1989 | Walters, Jr. ........... 307/443 |
| 4,820,942 | 4/1989 | Chan .................... 307/443 |
| 4,857,770 | 8/1989 | Partovi et al. . |
| 4,882,507 | 11/1989 | Tatsumi et al. . |
| 4,954,729 | 9/1990 | Urai . |

FOREIGN PATENT DOCUMENTS 3330559 8/1983 Fed. Rep. of Germany .

OTHER PUBLICATIONS

G. Canepa et al., "A 90ns 4Mb CMOS EPROM" 1988 IEEE International Solid-State Circuits Conference, Digest of Technical Papers (Feb. 18, 1988): pp. 120,121.
IBM Technical Disclosure Bulletin, vol. 30, No. 7, Dec. 1987, CMOS Output Inverter Circuit with Low Power Test Output Inverter, pp. 54–55.

*Primary Examiner*—John Zazworsky
*Attorney, Agent, or Firm*—Lowe, Price, LeBlanc & Becker

[57] ABSTRACT

In an output buffer circuit, two P channel MOSFET's (1, 2) are connected in parallel between a power supply terminal (16) and an output terminal (10), and two N channel MOSFET's (3, 4) are connected in parallel between the ground terminal (17) and the output terminal (10). When a normal power supply potential is applied to the power supply terminal (16), either one of the P channel MOSFET's (1, 2) or either one of N channel MOSFET's (3, 4) is turned on in response to an input signal. When a high potential is applied to the power supply terminal (16), two P channel MOSFET's (1, 2) or two N channel MOSFET's (3, 4) are turned on in response to the input signal.

12 Claims, 5 Drawing Sheets

| MODE | Vpp | INTERNAL DATA SIGNAL | STATE OF MOS FET | | | | OUTPUT TERMINAL |
|---|---|---|---|---|---|---|---|
| | | | 1 | 2 | 3 | 4 | |
| READ MODE (Vcc = 5V) | 5V | L | OFF | OFF | ON | ON | L |
| | | H | ON | ON | OFF | OFF | H |
| PROGRAM VERIFY MODE (Vcc = 6V) | 12.5V | L | OFF | OFF | ON | OFF | L |
| | | H | ON | OFF | OFF | OFF | H |

ON: CONDUCTIVE STATE
OFF: NON-CONDUCTIVE STATE

FIG. 9
|  | INTERNAL DATA SIGNAL | STATE OF MOS FET | | OUTPUT TERMINAL |
| --- | --- | --- | --- | --- |
|  |  | 1 | 3 |  |
| READ AND PROGRAM VERIFY | L | OFF | ON | L |
|  | H | ON | OFF | H |
ON: CONDUCTIVE STATE
OFF: NON-CONDUCTIVE STATE
FIG. 10 PRIOR ART
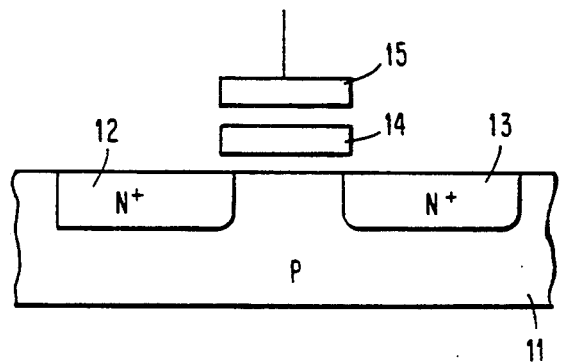
FIG. 11 PRIOR ART
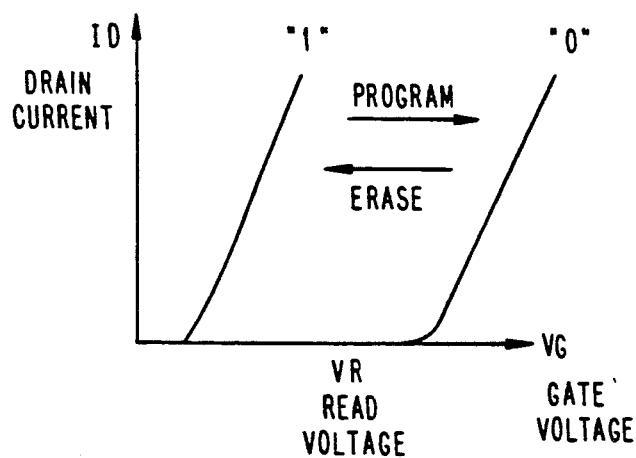
FIG. 12 PRIOR ART
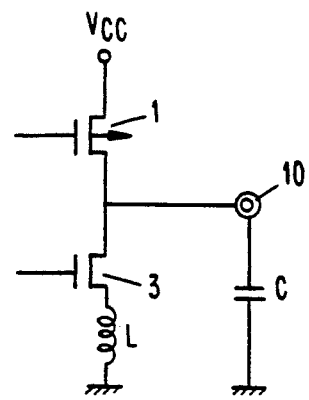

BUFFER CIRCUIT USED IN A SEMICONDUCTOR DEVICE OPERATING BY DIFFERENT SUPPLY POTENTIALS AND METHOD OF OPERATING THE SAME

This application is a continuation of application Ser. No. 405,997, filed Sept. 12, 1989, now U.S. Pat. No. 5,003,205, issued Mar. 26, 1991.

CROSS-REFERENCE TO CO-PENDING APPLICATION

This application is related to co-pending application Ser. No. 784,061 assigned to the same assignee of the present invention.

BACKGROUND OF THE INVENTION

1. Field of the Invention

The present invention relates to a buffer first circuit and, more particularly, a buffer circuit used in a semiconductor device operating by different supply potentials and a method of operating the same.

2. Description of the Background Art

FIG. 8 is a circuit diagram showing a structure of a conventional output buffer circuit used in an EPROM (Erasable and Programmable Read Only Memory).

The output buffer circuit shown in FIG. 8 comprises a P channel MOSFET 1 connected between an output terminal 10 and the supply potential Vcc, an N channel MOSFET 3 connected between the output terminal 10 and the ground potential, a NAND gate 5 for driving the P channel MOSFET 1 and a NOR gate 7 for driving the N channel MOSFET 3. An internal data signal Din is applied to one input terminal of the NAND gate 5 and the NOR gate 7 through an input terminal 9. An output control signal oe is applied to the other input terminal of the NAND gate 5 and an output control signal $\overline{oe}$ is applied to the other output terminal of the NOR gate 7. A plurality of output buffer circuits are usually provided in the EPROM corresponding to the number of bits of data.

Next, a description is given of operation of the output buffer circuit shown in FIG. 8 in reference to FIG. 9.

In a normal reading, the supply potential Vcc is set at 5V. First, it is assumed that the output control signals oe and $\overline{oe}$ are at logical high, or "H" level and logical low, or "L" level, respectively. In this case, when the internal data signal Din is at the "H" level the output of the NAND gate 5 becomes the "L" level and the output of the NOR gate 7 also becomes the "L" level. Then, the P channel MOSFET is rendered to be conductive and the N channel MOSFET3 is rendered to be non-conductive. As a result, output data Dout at the "H" level appears on an output terminal 10. On the other hand, when the internal data signal Din is at the "L" level, the output of the NAND gate 5 becomes the "H" level and the output of the NOR gate 7 becomes also the "H" level. Then, the P channel MOSFET 1 is rendered to be non-conductive and the N channel MOSFET 3 is rendered to be conductive. As a result, the output data Dout at the "L" level appears on the output terminal 10.

Next, it is assumed that the output control signal oe and $\overline{oe}$ are at the "L" level and the "H" level, respectively. In this case, the output of the NAND gate 5 becomes the "H" level and the output of the NOR gate 7 becomes the "L" level even if the output data signal Din is at either the "H" level or the "L" level. Then, both P channel MOSFET 1 and N channel MOSFET 3 are rendered to be non-conductive and the output terminal 10 becomes the floating state (the high impedance state).

For example, the above-described eight output buffer circuits are provided in the EPROM in which 8-bit data is read and sixteen output buffer circuits are provided in the EPROM in which 16-bit data is read. In a normal reading, it is necessary for all output buffer circuits to operate stably at high speed.

In data programming to the EPROM, data is programmed in units of one byte or several bytes. In order to verify whether the data is normally programmed or not, data is read from the EPROM. This operation is called "program verify".

FIG. 10 is a sectional view of a memory transistor comprised in the EPROM. The memory transistor comprises a source 12 and a drain 13 formed of an N+ layer formed on a P type semiconductor substrate 11, a floating gate 14 and a control gate 15.

In data programming, a supply potential Vpp for programming is applied to the control gate 15. The supply potential Vpp for programming is set at 12.5V. At this time, the source 12 is set at 0V and the drain 13 is set at approximately 8V. In addition, in data reading, a supply potential Vcc is applied to the control gate 15. At this time, the voltage of the source 12 becomes 0V and the voltage of the drain 13 becomes approximately 1V. Although the supply potential Vcc is set at 5V in normal reading, it is set at 6~6.5V at the time of the "program verify".

FIG. 11 is a diagram showing the relation between a drain current $I_D$ and a gate voltage $V_G$ of the control gate of the memory transistor. Data "0" or data "1" is stored in this memory transistor depending on whether electrons are stored in the floating gate 14 or not. More specifically, when electrons are stored in the floating gate 14 by the above-described programming operation, the threshold voltage of the memory transistor is increased. Therefore, when the supply potential Vcc is applied to the control gate 15, a path between the source 12 and the drain 13 is rendered to be non-conductive. This state shows that the data "0" is stored in the memory transistor. On the contrary, when electrons are extracted from the floating gate 14, the threshold voltage of this memory transistor is decreased. Therefore, when the supply potential Vcc is applied to the control gate 15, a path between the source 12 and the drain 13 are rendered to be conductive. This state shows that the data "1" is stored in the memory transistor. In addition, the data "0" is stored in the memory transistor by programming operation and the data "1" is stored in the memory transistor by erasing operation.

At the time of the "program verify", the reason why the supply potential Vcc is set at a potential higher than 5V at the time of normal reading is to verify that the data "0" is programmed in the memory transistor with sufficient margin. More specifically, when the normal programming to the memory transistor is performed, the threshold voltage of the memory transistor becomes sufficiently higher than the read voltage $V_R$ as shown in FIG. 11. Therefore, by increasing the supply potential Vcc applied to the control gate 15 to perform reading operation, it can be verified whether the reading operation is performed with sufficient margin or not.

However, in the above-described conventional output buffer circuit, when the supply potential Vcc is increased at the time of the "program verify", an output charging/discharging current, a through current and the like are increased as compared with the time the supply potential Vcc is at 5V. As shown in FIG. 12, load capacitance C is coupled between the output terminal 10 and the ground potential, and inductance L exists in a wiring between the N channel MOSFET 3 and the ground potential. For example, when the N channel MOSFET 3 turns on, an electric charge in the load capacitance C is discharged through the inductance L. At this time, a voltage v shown in the following equation is generated in the inductance L.

$$v = L \cdot (di/dt)$$

where i represents a current and t represents a time period. Therefore, a noise will be generated in the ground potential. As can be understood from the above equation, as the current is increased, the noise is also increased.

Since a plurality of output buffer circuits are provided especially in the EPROM, it is necessary to consider the influence of the noise generated when the supply potential Vcc is increased.

As described above, there is a disadvantage that a switching noise is increased at the time of the "program verify" which increases and operates the supply potential Vcc in the conventional output buffer circuit as compared with the time of normal reading operation, with the results that stable operation of the "program verify" is prevented.

In addition, a page programming mode is started to be used in 1M bit of EPROM. In this page programming mode, 2-word data to be programmed is latched in the inside once, and the latched 2 word data is programmed at the same time. Therefore, there is another disadvantage that the contents of the latch data would be destroyed if the noise generated at the time of the "program verify" is larger.

SUMMARY OF THE INVENTION

An object of the present invention is to reduce a switching noise in a buffer circuit apparatus operating at different supply potentials.

Another object of the present invention is to stabilize the operation of a buffer circuit apparatus operating at different supply potentials.

A further object of the present invention is to reduce a noise generated in the operation at high supply potential in a CMOS buffer circuit.

Still another object of the present invention is to reduce a switching noise to improve the stability of operation in a buffer circuit used in a non-volatile memory device.

A still further object of the present invention is to provide an improved method of operating a buffer circuit apparatus capable of operating reliably at different supply potentials.

A buffer circuit in accordance with the present invention comprises an input terminal, a first power supply terminal, a second power supply terminal, an output terminal, first switching means, second switching means, third switching means, fourth switching means and control means. The input terminal receives an input signal of a first logical level or a second logical level. A predetermined first or second potential is applied to the first power supply terminal. A predetermined third potential is applied to the second power supply terminal. The first and second switching means are coupled in parallel between the first power supply terminal and the output terminal. The third and fourth switching means are coupled in parallel between the second power supply terminal and the output terminal.

The control means renders either one of the first or second switching means conductive and the remaining switching means non-conductive in response to the input signal of the first logical level applied to the input terminal when the first potential is applied to the first power supply terminal. In addition, the controlling means renders either one of the third or fourth switching means conductive and the remaining switching means non-conductive in response to the input signal of the second logical level applied to the input terminal when the first potential is applied to the first power supply terminal. On the other hand, the controlling means renders the first and second switching means conductive and the third and fourth switching means non-conductive in response to the input signal of the first logical level applied to the input terminal when the second potential is applied to the first power supply terminal. In addition, the controlling means renders the third and fourth switching means conductive and the first and second switching means non-conductive in response to the input signal of the second logical level applied to the input terminal when the second potential is applied to the first power supply terminal.

In the buffer circuit in accordance with the present invention, when the first potential is applied to the first power supply terminal, one switching means is rendered to be conductive in response to the input signal. In addition, when the second potential is applied to the first power supply terminal, two switching means are rendered to be conductive in response to the input signal. Therefore, when the first potential is applied to the first power supply terminal, current driving capability is decreased as compared with the time the second potential is applied to the first power supply terminal. As a result, a switching noise can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram for describing operation of the output buffer circuit in FIG. 8;

FIG. 10 is a sectional view showing a structure of a memory transistor comprised in the EPROM in FIG. 10;

FIG. 11 is a diagram showing the relation between a gate voltage and a drain current in a memory transistor;

FIG. 12 is an equivalent circuit diagram for describing a noise generated at the time of switching of the output buffer circuit.

DESCRIPTION OF THE PREFERRED EMBODIMENTS

Referring to drawings, a description is given of embodiments of the present invention.

In the embodiments, a description is given to a case where a buffer circuit in accordance with the present invention is applied to the EPROM.

Figure 3:
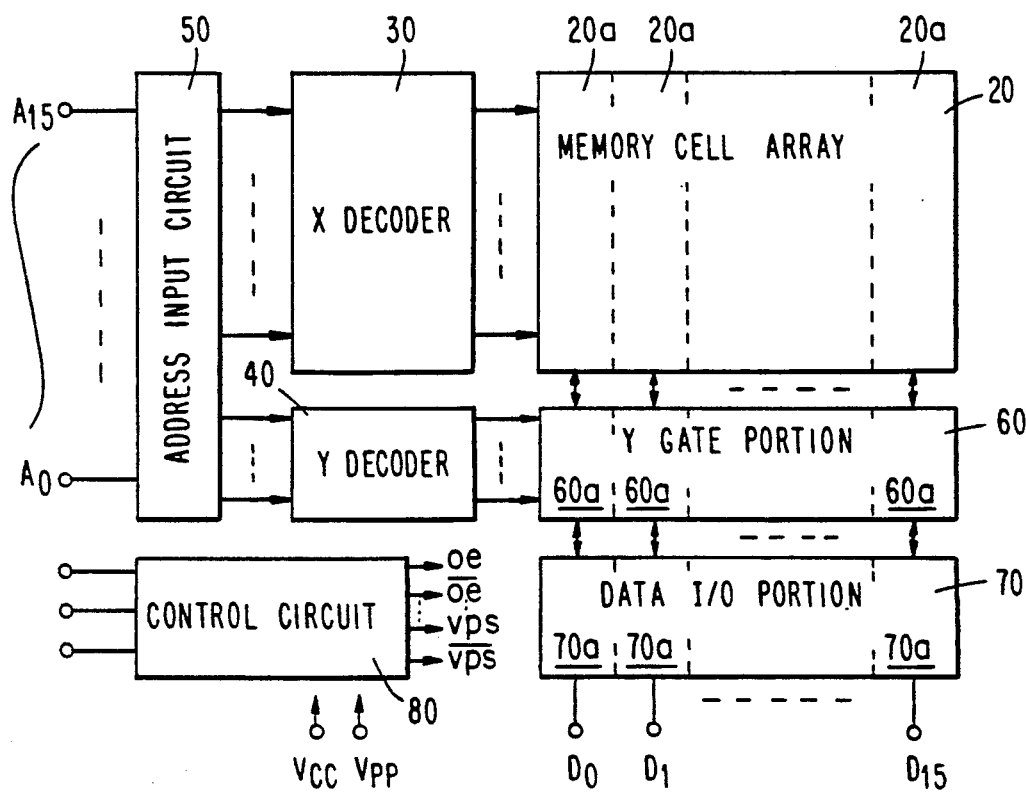
FIG. 3 is a block diagram showing a structure of an EPROM to which the output buffer circuit in FIG. 1 is applied.
Figure 4:
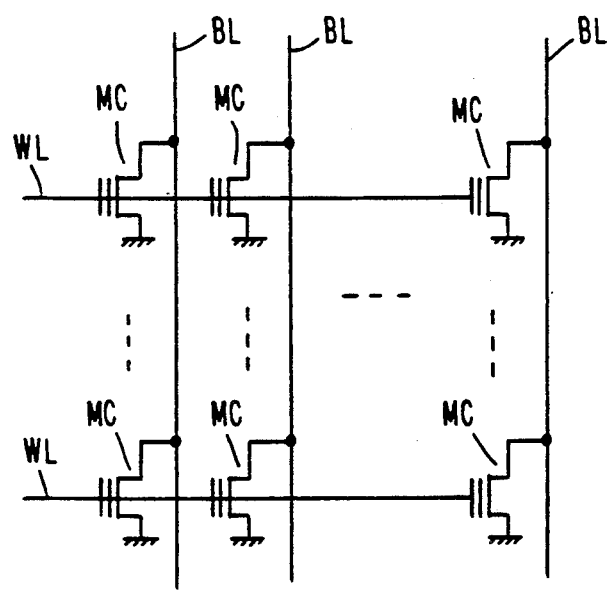
FIG. 4 is a circuit diagram showing a structure of a memory cell array comprised in the EPROM in FIG. 3.

FIG. 3 is a block diagram showing a structure of the EPROM to which the buffer circuit in accordance with the present invention is applied. Referring to FIG. 3, the EPROM comprises a memory cell array 20, an X decoder 30, a Y decoder 40, an address input circuit 50, a Y gate portion 60, a data I/0 portion 70 and a control circuit 80. FIG. 4 is a circuit diagram of memory cell array wherein a plurality of word lines WL and bit lines BL are arranged so as to intersect with each other in the memory cell array 20 and a memory cell MC is provided at each intersecting point. The memory cell MC comprises a memory transistor shown in FIG. 10. As shown in FIG. 3, memory cell array 20 comprises sixteen memory cell array blocks 20a. The Y gate portion 60 comprises a plurality of Y gates 60a corresponding to the plurality of memory cell array blocks 20a. The data I/0 portion 70 comprises a plurality of data I/O circuits 70a corresponding to the plurality of memory cell array blocks 20a. Various control signals are applied from the external to the control circuit 80. The control circuit 80 generates various timing signals in response to the control signals to control operation of each portion of the EPROM.

Address signals A0~A15 are externally applied to the address input circuit 50. X address signals are applied from the address input circuit 50 to the X decoder 30. Y address signals are applied from the address input circuit 50 to the Y decoder 40. The X decoder 30 selects one of plurality of word lines WL in the memory cell array 20 in response to the X address signals. The Y decoder 40 selects one of bit lines BL in each of memory cell array blocks 20a in response to the Y address signals. The plurality of Y gates 60a connect the corresponding bit lines BL selected in the memory cell array blocks 20a to the corresponding data I/O circuits 70a. The memory cells MC provided on the intersecting points of thus selected word line WL and the bit lines BL are selected.

In data reading, data D0~D15 are read from the thus selected memory cells MC through the Y gate portion 60 and the data I/O portion 70. On the other hand, in data programming, the data D0~D15 are programmed into the selected memory cells MC through the data I/O portion 70 and the Y gate portion 60.

Figure 5:
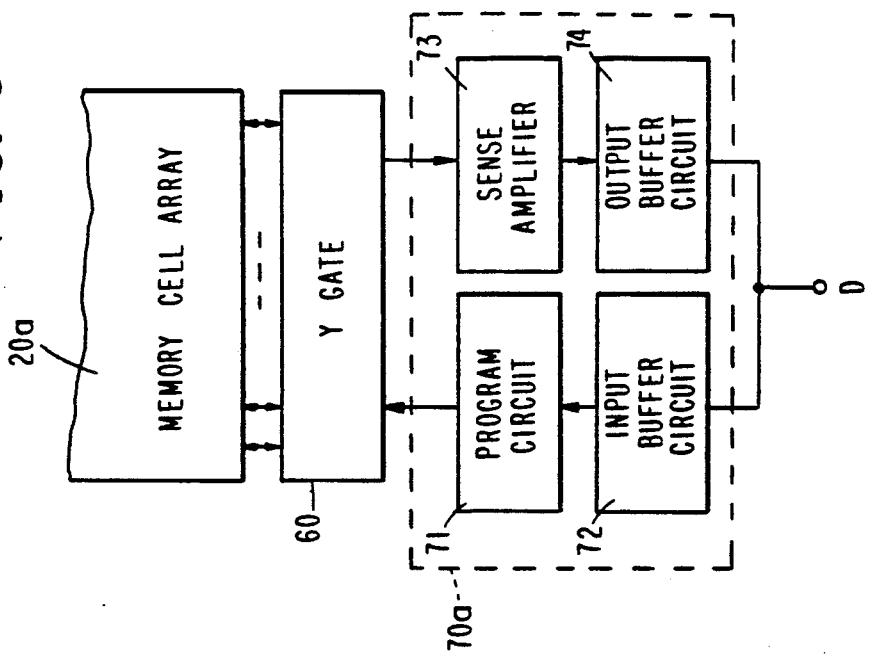
FIG. 5 is a block diagram showing one example of a structure of a data I/0 circuit comprised in the EPROM in FIG. 3.

FIG. 5 is a block diagram showing a structure of a data I/O circuit 70a comprised in the data I/O portion 70.

The data I/O circuit 70a comprises a program circuit 71, an input buffer circuit 72, a sense amplifier 73 and an output buffer circuit 74. The input buffer circuit 72 applies data D externally applied to the program circuit 71 in data programming. The program circuit 71 applies a predetermined voltage to a selected bit line through the Y gate 60. In addition, the sense amplifier 73 amplifies a potential on a selected bit line in data reading. The output buffer circuit 74 outputs the output of the sense amplifier 73 to the outside as data D at a predetermined timing. The output buffer circuit in accordance with one embodiment of the present invention is applied to this output buffer circuit 74.

Figure 6:
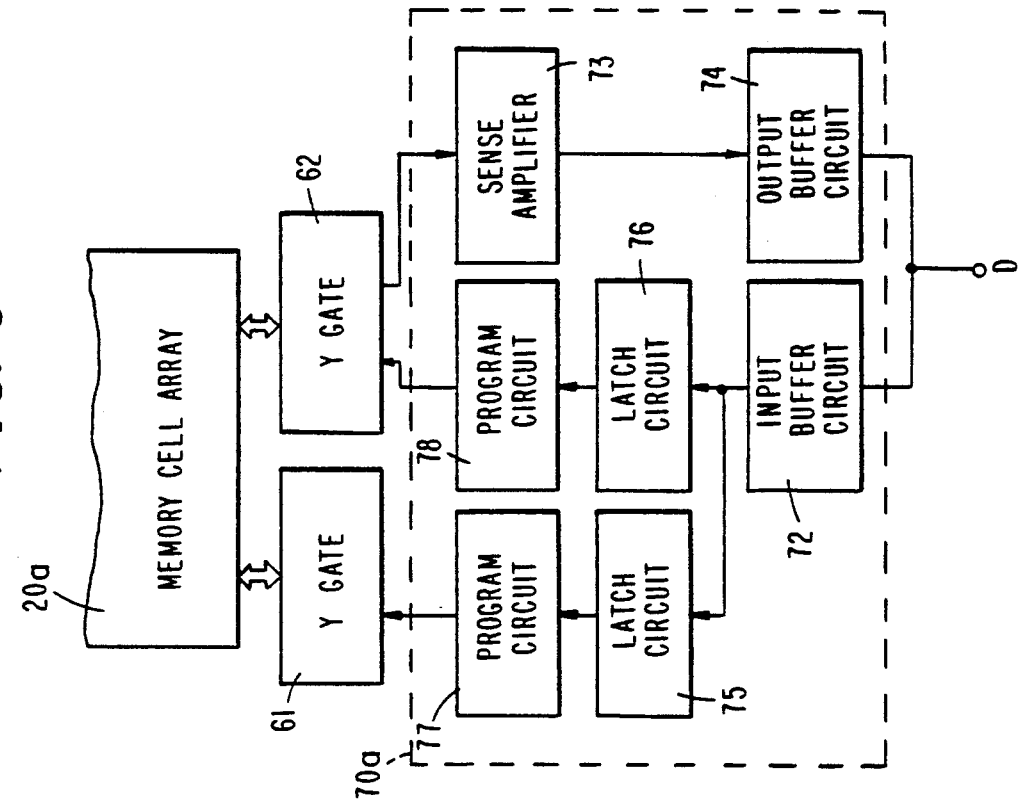
FIG. 6 is a block diagram showing another example of a structure of a data I/0 circuit comprised in the EPROM in FIG. 3.

In the EPROM of a page programming mode, the data I/O circuit 70a is structured as shown in FIG. 6. Referring to FIG. 6, two latch circuits 75 and 76 and two program circuits 77 and 78 are provided in the data I/O circuit 70a. In addition, two Y gates 61 and 62 are provided to one memory cell array block 20a. In data programming, data to be programmed are latched by latch circuits 75 and 76, then, the data held in the latch circuits 75 and 76 are programmed into a selected memory cell in the memory cell array block 20a through the program circuits 77 and 78 and Y gates 61 and 62 at the same time. According to this page programming mode, time required for data programming can be shortened.

Figures 1, 2:
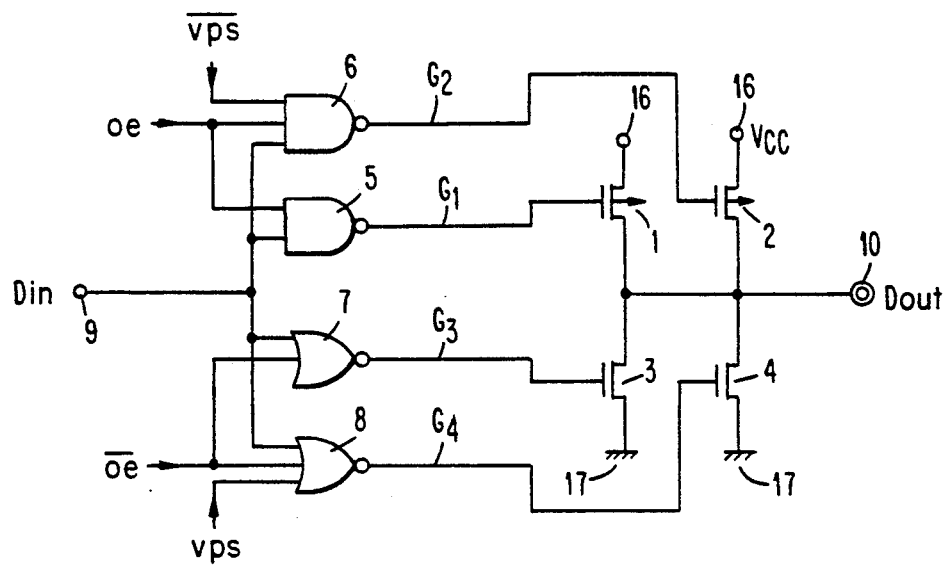
FIG. 1 is a circuit diagram showing a structure of an output buffer circuit in accordance with one embodiment of the present invention.
FIG. 2 is a diagram for describing operation of the output buffer circuit in FIG. 1.

FIG. 1 is a circuit diagram showing a structure of an output buffer circuit in accordance with one embodiment of the present invention.

An output buffer circuit in FIG. 1 comprises P channel MOSFET's 1 and 2, N channel MOSFET's 3 and 4, NAND gates 5 and 6, and NOR gates 7 and 8. The P channel MOSFET's 1 and 2 are connected in parallel between power supply terminals 16 and an output terminal 10. The N channel MOSFET's 3 and 4 are connected in parallel between ground terminals 17 and the output terminal 10. A supply potential Vcc is applied to the power supply terminals 16 and the ground potential is applied to the ground terminals 17.

An inverted voltage sense signal $\overline{VPS}$ is applied to a first input terminal of the NAND gate 6 and a voltage sense signal VPS is applied to a first input terminal of the NOR gate 8. An output control signal oe is applied to a second input terminal of the NAND gate 6 and one input terminal of the NAND gate 5. An output control signal $\overline{oe}$ is applied to a second input terminal of the NOR gate 8 and one input terminal of the NOR gate 7. A third input terminal of the NAND gate 6, the other input terminal of the NAND gate 5, the other input terminal of the NOR gate 7 and a third input terminal of the NOR gate 8 are connected to an input terminal 9 which receives an internal data signal Din. The voltage sense signals VPS and $\overline{VPS}$ and the output control signals oe and $\overline{oe}$ are applied from the control circuit 80 shown in FIG. 3. In addition, the input terminal 9 is connected to the sense amplifier 73 shown in FIG. 5.

Figure 8:
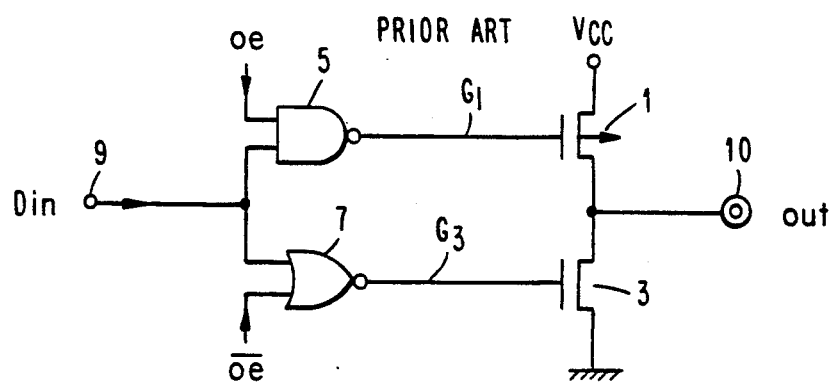
FIG. 8 is a circuit diagram showing a structure of a conventional output buffer circuit.

Each of the P channel MOSFET's 1 and 2 and the N channel MOSFET's 3 and 4 is formed such that current driving capability is about half that of the MOSFET comprised in the conventional output buffer circuit shown in FIG. 8. More specifically, the size of each of the MOSFET's 1~4 comprised in the output buffer circuit in FIG. 1 is formed to be about half the size of each of the MOSFET's 1 and 3 comprised in the conventional output buffer circuit shown in FIG. 8.

Next, referring to FIG. 2, a description is given of operation of the output buffer circuit shown in FIG. 1.

When the supply potential Vpp of the power supply applied to an input node of control circuit 80 for programming is at 5V, the voltage sense signal VPS provided by control circuit 80 to an input node of NOR gate 8 attains the "L" level and the voltage sense signal $\overline{VPS}$ provided by control circuit 80 to an input node of NAND gate 6 attains the "H" level. On the other hand, when the supply potential Vpp of the power supply for programming is at 12.5V (program voltage), the voltage sense signal VPS attains the "H" level and the voltage sense signal $\overline{VPS}$ attains the "L" level.

In normal data reading, the supply potential Vcc and the supply potential Vpp of the power supply for programming are both set at 5V. Therefore, the voltage sense signals VPS and $\overline{VPS}$ attains the "L" level and the "H" level, respectively. In addition, it is assumed that the output control signals oe and $\overline{oe}$ are at the "H" level and the "L" level, respectively. First, when the internal data signal Din applied to the input terminal 9 is at the "H" level, the outputs of the NAND gates 5 and 6 become the "L" level and the outputs of the NOR gate 7 and 8 also become the "L" level. As a result, the P channel MOSFET's 1 and 2 are rendered to be conductive and the N channel MOSFET's 3 and 4 are rendered to be non-conductive. As a result, the output data Dout at the "H" level appears on the output terminal 10.

Similarly, when the internal data signal Din is at the "L" level, both outputs of the NAND gates 5 and 6 become the "H" level and both outputs of the NOR gates 7 and 8 become the "H" level. As a result, both P channel MOSFET's 1 and 2 are rendered to be non-conductive and both N channel MOSFET's 3 and 4 are rendered to be conductive. Consequently, the output data Dout at the "L" level appears on the output terminal 10.

In the above case, the size of MOSFET's 1~4 is about half the size of each of the MOSFET's 1 and 3 shown in FIG. 8 and the P channel MOSFET's 1 and 2 or the N channel MOSFET's 3 and 4 are rendered to be conductive at the same time, so that a current flowing in the output buffer circuit in FIG. 1 is the same as that in the conventional output buffer circuit in FIG. 8.

Next, at the time of the "program verify", the supply potential Vcc is set at 6V or 6.25~6.5V and the supply potential Vpp of the power supply for programming is set at 12.5V. Therefore, the voltage sense signals VPS and $\overline{VPS}$ attain the "H" level and the "L" level, respectively. Also, it is assumed that the output control signals oe and $\overline{oe}$ are at the "H" level and the "L" level, respectively. In this case, the output of the NAND gate 6 become the "H" level even if the internal data signal Din is at either the "H" level or the "L" level. Therefore, the P channel MOSFET2 is always in the non-conductive state. Similarly, the output of the NOR gate 8 becomes the "L" level even if the internal data signal Din is at either the "H" level or the "L" level. Therefore, the N channel MOSFET 4 is always in the non-conductive state. At this time, the NAND gate 5 and the NOR gate 7 operate in the same manner in a case of conventional data reading operation. More specifically, when the internal data signal Din is at the "H" level, the output of the NAND gate 5 becomes the "L" level. As a result, the p channel MOSFET1 is rendered to be conductive and the output data Dout at the "H" level appears on the output terminal 10. In addition, when the internal data signal Din is at the "L" level, the output of the NOR gate 7 becomes the "H" level. As a result, the N channel MOSFET 3 is rendered to be conductive and the output data Din at the "L" level appears on the output terminal 10.

In this manner, the number of the MOSFET's rendered to be conductive at the time of the "program verify" is half the number of MOSFET's rendered to be conductive at the time of normal reading operation. Therefore, current flowing in the output buffer at the time of the "program verify" becomes less than that in the output buffer circuit at the time of the normal reading operation. As a result, even if the supply potential Vcc is raised, a noise generated at the time of switching operation is decreased.

In addition, since an access speed at the time of the "program verify" may be slower than an access speed at the time of the normal reading operation, there is no problem even if the current driving capability of the output buffer circuit is decreased at the time of the "program verify".

It is assumed that the output control signals oe and $\overline{oe}$ are at the "L" level and the "H" level, respectively. In this case, both outputs of the NAND gates 5 and 6 become the "H" level and both outputs of the NOR gates 7 and 8 become the "L" level. Therefore, the P channel MOSFET's 1 and 2 and N channel MOSFET's 3 and 4 are rendered to be non-conductive and the output terminal 10 becomes the floating state.

Figure 7:
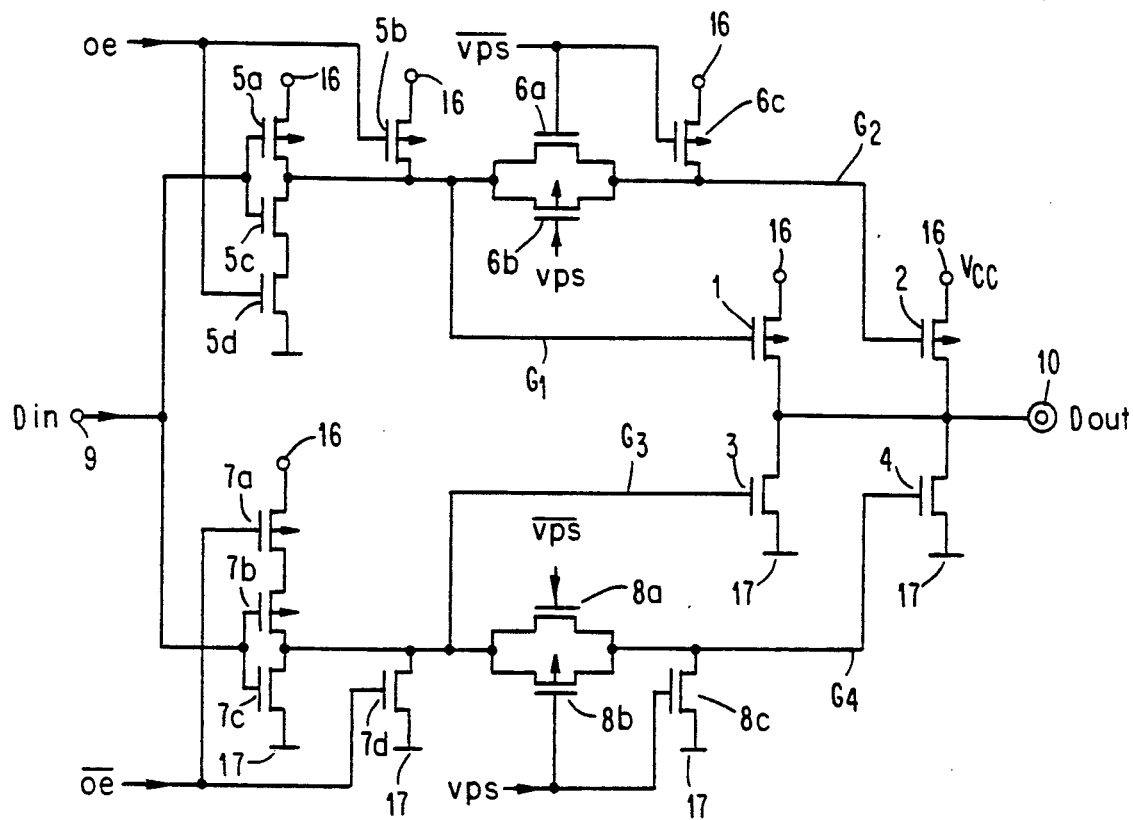
FIG. 7 is a circuit diagram showing a structure of an output buffer circuit in accordance with another embodiment of the present invention.

FIG. 7 is a circuit diagram showing a structure of an output buffer circuit in accordance with another embodiment of the present invention.

Referring to FIG. 7, P channel MOSFET's 5a and 5b and N channel MOSFET's 5c and 5d constitute a circuit corresponding to the NAND gate 5 shown in FIG. 1. P channel MOSFET's 7a and 7b and N channel MOSFET's 7c and 7d constitute a circuit corresponding to the NOR gate 7 shown in FIG. 1. In addition, a circuit comprising an N channel MOSFET 6a and P channel MOSFET's 6b and 6c is provided instead of the NAND gate 6 shown in FIG. 1. A circuit comprising N channel MOSFET's 8a and 8c and a P channel MOSFET 8b is provided instead of the NOR gate 8 shown in FIG. 1.

In normal reading operation, the supply potential Vpp of the power supply for programming is set at 5V and similar to the case of the output buffer circuit in FIG. 1, the voltage sense signals VPS and $\overline{VPS}$ attain the "L" level and the "H" level, respectively. As a result, the MOSFET's 6a, 6b, 8a and 8b are rendered to be conductive and the MOSFET's 6c and 8c are rendered to be non-conductive. Therefore, the potential of a gate G1 of the P channel MOSFET1 and the potential of a gate G2 of the P channel MOSFET2 become the same potential. Similarly, the potential of a gate G3 of the N channel MOSFET 3 and the potential of a gate G4 of the N channel MOSFET 4 become the same.

It is assumed that the output control signals oe and $\overline{oe}$ are at the "H" level and the "L" level, respectively. At this time, the MOSFET's 5d and 7a are rendered to be conductive and the MOSFET's 5b and 7d are rendered to be non-conductive. As a result, the MOSFET's 5a and 5c serve as an inverter and the MOSFET's 7b and 7c serve as an inverter. Therefore, when the internal data signal Din is at the "H" level, both P channel MOSFET's 1 and 2 are rendered to be conductive and the output data Dout at the "H" level appears on the output terminal 10. On the contrary, when the internal data signal Din is at the "L" level, both N channel MOSFET's 3 and 4 are rendered to be conductive and the output data Dout at the "L" level appears on the output terminal 10.

At the time of the "program verify", the supply potential Vpp of the power supply for programming is set at 12.5V. As a result, the voltage sense signals VPS and $\overline{VPS}$ attain the "H" level and the "L" level, respectively. In this case, the MOSFET's 6a, 6b, 8a and 8b are rendered to be non-conductive and the MOSFET's 6c and 8c are rendered to be conductive. As a result, the potential of the gate G2 of the P channel MOSFET 2 becomes the "H" level and the potential of the gate G4 of the N channel MOSFET 4 becomes the "L" level. As a result, the P channel MOSFET 2 and the N channel MOSFET 4 are rendered to be non-conductive. In this state, only the P channel MOSFET 1 and the N channel MOSFET 3 are operable. Therefore, when the internal data signal Din is at the "H" level, the P channel MOSFET 1 is rendered to be conductive and the output data Dout at the "H" level appears on the output terminal 10. On the contrary, when the internal data signal Din is the "L" level, the N channel MOSFET 3 is rendered to be conductive and the output data Dout at the "L" level appears on the output terminal 10.

In addition, the operation when the output control signals oe and $\overline{oe}$ are at the "L" level and the "H" level, respectively is the same that in the output buffer circuit in FIG. 1.

As described above, the output buffer circuit shown in FIG. 7 has the same effect as that shown in FIG. 1.

Although each of first to fourth switching means is constituted by one MOSFET in the above-described embodiment, each of the first to fourth switching means may be constituted by a plurality of switching elements.

POST DESCRIPTION SUMMARY

According to the present invention, since current driving capability when the first potential is applied to the first power supply terminal is decreased as compared with the current driving capability when the second potential is applied to the first power supply terminal, it is possible to provide a buffer circuit having a reduced switching noise and operating in a stable manner.

Although the present invention has been described and illustrated in detail, it is clearly understood that the same is by way of illustration an example only and is not to be taken by way of limitation, the spirit and scope of the present invention being limited only by the terms of the appended claims.

What is claimed is:

1. A buffer circuit apparatus operated by different supply potentials comprising:
   an input node receiving an input signal of a first or second logic level;
   a first power supply node to which a predetermined first or second potential is applied;
   a second power supply node to which a predetermined third potential is applied;
   a third power supply node to which a predetermined fourth or fifth potential is applied;
   an output node;
   first and second switching means coupled in parallel between said first power supply node and said output node;
   third and fourth switching means coupled in parallel between said second power supply node and said output node; and
   controlling means for controlling said first, second, third and fourth switching means in response to an input signal applied to said input node and in response to said predetermined fourth or fifth potential applied to said third power supply node,
   said controlling means responsive to application of said fourth potential to said third power supply node for rendering either one of said first or second switching means conductive and the remaining said switching means non-conductive in response to the input signal of said first logic level applied to said input node, and rendering either one of said third or fourth switching means conductive and the remaining switching means non-conductive in response to the input signal of said second logic level applied to said input node, and
   said controlling means responsive to application of said predetermined fifth potential to said third power supply node for rendering said first and second switching means conductive and said third and fourth switching means non-conductive in response to the input signal of said first logic level applied to said input node, and rendering said third and fourth switching means conductive and said first and second switching means non-conductive in response to the input signal of said second logic level applied to said input node.

2. A buffer circuit apparatus in accordance with claim 1, wherein each of said first, second, third and fourth switching means comprises a field effect device.

3. A buffer circuit apparatus in accordance with claim 2, wherein said field effect device comprises an MOS field effect transistor.

4. A buffer circuit apparatus in accordance with claim 1, wherein,
   said first logic level is high,
   said second logic level is low,
   said predetermined fifth potential is substantially equal to said second potential,
   said predetermined first and fourth potentials are each higher than said predetermined second and fifth potentials,
   said predetermined third potential is equal to a ground potential,
   each of said first and second switching means comprises a P channel MOS field effect transistor, and
   each of said third and fourth switching means comprises an N channel MOS field effect transistor.

5. A buffer circuit apparatus in accordance with claim 1, wherein said controlling means receives a first voltage sense signal when said predetermined fourth potential is applied to said third power supply node,
   further receives a second voltage sense signal when said predetermined fifth potential is applied to said third power supply node,
   renders either one of said first or second switching means conductive and the remaining said switching means non-conductive in response to said first voltage sense signal and said input signal of the first logic level,
   renders either one of said third or fourth switching means conductive and the remaining said switching means non-conductive in response to said first voltage sense signal and said input signal of the second logic level,
   renders said first and second switching means conductive and said third and fourth switching means non-conductive in response to said second voltage sense signal and said input signal of the first logic level and renders said third and fourth switching means conductive and said first and second switching means non-conductive in response to said second voltage sense signal and said input signal of the second logic level.

6. A buffer circuit apparatus in accordance with claim 5, wherein said controlling means further receives a first or second output control signal and renders the first to fourth switching means non-conductive in response to said second output control signal.

7. A buffer circuit apparatus in accordance with claim 6, said controlling means comprises:
a first logic circuit rendering said first switching means conductive in response to said first output control signal and said input signal of the first logic level;
a second logic circuit rendering said second switching means conductive in response to said first output control signal, said input signal of the first logic level and said second voltage sense signal;
a third logic circuit rendering said third switching means conductive in response to said first output control signal and said input signal of the second logic level; and
a fourth logic circuit rendering said fourth switching means conductive in response to said first output control signal, said input signal of the second logic level and said second voltage sense signal.

8. A buffer circuit apparatus in accordance with claim 7, wherein,
said first logic level is high,
said second logic level is low,
said predetermined fifth potential is the predetermined power supply potential,
said predetermined fourth potential is higher than said predetermined power supply potential,
said predetermined third potential is the ground potential,
each of said first and second switching means comprises a P channel MOS field effect transistor, and
each of said third and fourth switching means comprises an N channel MOS field effect transistor.

9. A buffer circuit apparatus in accordance with claim 8, wherein
said first logic circuit includes a first input node receiving said first or second output control signal and a second input node receiving said input signal of the first or second logic level and outputting a low level signal in response to said first output control signal and said input signal of the first logic level;
said second logic circuit includes a first input node receiving said first or second output control signal, a second input node receiving said input signal of the first or second logic level and a third input node receiving an inverted signal of said first or second voltage sense signal and outputting a low level signal in response to said first output control signal, said input signal of the first logic level and the inverted signal of said second voltage sense signal;
said third logic circuit includes a first input node receiving an inverted signal of said first or second output control signal and a second input node receiving said input signal of the first or second logic level and outputting a high level signal in response to said inverted signal of the first output control signal and said output signal of the second logic level; and
said fourth logic circuit includes a first input node receiving an inverted signal of said first or second output control signal, a second input node receiving said input signal of the first or second logic level and a third input node receiving said first or second voltage sense signal and outputting a high level signal in response to the inverted signal of said first output control signal, said input signal of the second logic level and said second voltage sense signal;
said first switching means has a gate electrode receiving an output of said first logic circuit;
said second switching means has a gate electrode receiving the output of said second logic circuit;
said third switching means has a gate electrode receiving the output of said third logic circuit; and
said fourth switching means has a gate electrode receiving the output of said fourth logic circuit.

10. A buffer circuit apparatus in accordance with claim 8, wherein
said first logic circuit includes a first input node receiving said first or second output control signal and a second input node receiving said input signal of the first or second logic level, outputting the inverted signal of said input signal in response to said first output control signal and outputting a high level signal in response to said second output control signal;
said second logic circuit includes a first input node receiving the inverted signal of said first or second voltage sense signal and a second input node receiving the output of said first logic circuit, outputting a high level signal in response to said first voltage sense signal and outputting the same signal as that of the output of said first logic circuit in response to the inverted signal of said second voltage sense signal;
said third logic circuit includes a first input node receiving the inverted signal of said first or second output control signal and a second input node receiving said input signal of the first or second logic level, outputting the inverted signal of said input signal in response to the inverted signal of said first output control signal and outputting a low level signal in response to the inverted signal of said second output control signal; and
said fourth logic circuit includes a first input node receiving said first or second voltage sense signal and a second input node receiving the output of said third logic circuit, outputting a low level signal in response to said first voltage sense signal and outputting the same signal as that of the output of said third logic circuit in response to said second voltage sense signal;
said first switching means has a gate electrode receiving the output of said first logic circuit;
said second switching means has a gate electrode receiving the output of said second logic circuit;
said third switching means has a gate electrode receiving the output of said third logic circuit; and
said fourth switching means has a gate electrode receiving the output of said fourth logic circuit.

11. A buffer circuit used in a non-volatile memory device, to which the predetermined supply potential or high potential is applied, said buffer circuit comprising:
an input node receiving a high level or low level input signal;
a first power supply node to which said predetermined supply potential or said predetermined high potential is applied;
a second power supply node to which the ground potential is applied;
a third power supply node to which a predetermined supply potential or a programming power supply potential is applied;
an output node;

first and second P channel MOS field effect devices coupled in parallel between said first power supply node and said output node;

third and fourth N channel MOS field effect devices coupled in parallel between said second power supply node and said output node; and controlling means responsive to an input signal applied to said input node for controlling said first, second, third and fourth field effect devices;

said controlling means being responsive to (a) said programming power supply potential being applied to said third power supply node, rendering either one of said first or second field effect device conductive and the remaining said field effect device non-conductive in response to said input signal of the high level applied to said input node, and either one of said third or fourth field effect device conductive and the remaining said field effect device non-conductive in response to said input signal of the low level applied to said input node, and (b) said predetermined supply potential being applied to said third power supply node rendering said first and second field effect devices conductive and said third and fourth field effect devices non-conductive in response to said input signal of the high level applied to said input node, and said third and fourth field effect devices conductive and said first and second field effect devices non-conductive in response to said input signal of the low level applied to said input node.

12. A method of operating a buffer circuit, said buffer circuit including:

(i) an input node receiving the input signal of a first or second logic level, (ii) a first power supply node to which a predetermined first or second potential is applied, (iii) a second power supply node to which a predetermined third potential is applied, (iv) a third power supply node to which a predetermined fourth or fifth potential is applied, (v) an output node, (vi) first and second switching means coupled in parallel between said first power supply node and said output node, and (vii) third and fourth switching means coupled in parallel between said second power supply node and said output node, said method of operating said buffer circuit comprising the steps of:

(a) applying said predetermined fifth potential to said third power supply node;

(b) applying an input signal of said first logic level to said input node;

(c) responsive to steps (a) and (b) rendering said first and second switching means conductive and said third and fourth switching means non-conductive;

(d) applying an input signal of said second logic level to said input node;

(e) responsive to steps (a) and (b) rendering said third and fourth switching means conductive and said first and second switching means non-conductive;

(f) applying said predetermined fourth potential to said third power supply node;

(g) applying an input signal of said first logic level to said input node;

(h) responsive to steps (f) and (g) rendering either one of said first or second switching means conductive and the remaining said switching means non-conductive;

(i) applying an input signal of said second logic level to said input node;

and responsive to steps (f) and (i) rendering either one of said third or fourth switching means conductive and the remaining said switching means non-conductive.

* * * * *